United States Patent
Jones, Jr. et al.

(10) Patent No.: US 6,657,461 B2
(45) Date of Patent: Dec. 2, 2003

(54) SYSTEM AND METHOD FOR HIGH SPEED INTEGRATED CIRCUIT DEVICE TESTING UTILIZING A LOWER SPEED TEST ENVIRONMENT

(75) Inventors: Oscar Frederick Jones, Jr., Colorado Springs, CO (US); Michael C. Parris, Colorado Springs, CO (US)

(73) Assignee: Mosel Vitelic Inc., Hsinchu (TW)

( * ) Notice: Subject to any disclaimer, the term of this patent is extended or adjusted under 35 U.S.C. 154(b) by 139 days.

(21) Appl. No.: 09/815,146

(22) Filed: Mar. 22, 2001

(65) Prior Publication Data

US 2002/0135393 A1 Sep. 26, 2002

(51) Int. Cl.⁷ .............................................. G11C 13/00
(52) U.S. Cl. ........................................ 327/99; 365/233
(58) Field of Search .................. 327/99, 299; 365/201, 365/233

(56) References Cited

U.S. PATENT DOCUMENTS 5,731,728 A * 3/1998 Greiss ......................... 327/299
6,031,786 A * 2/2000 Jang et al. ................... 365/233
6,275,444 B1 * 8/2001 Nakano et al. .............. 365/233
6,295,238 B1 * 9/2001 Tanizaki et al. ............. 365/201

* cited by examiner

Primary Examiner—Dinh T. Le
(74) Attorney, Agent, or Firm—William J. Kubida; Peter J. Meza; Hogan & Hartson LLP

(57) ABSTRACT

A system and method for low cost testing of integrated circuit devices at their rated speed during wafer probe testing while input signals to, and output signals from, the device may be operated at a lower speed. In the exemplary embodiment disclosed, a probe pad is used to enable a special test mode. When enabled, the on-chip clock generator enables a clock frequency doubler. The frequency doubler generates a 2x frequency clock from the 1x frequency external clock signals (two 1x clock phases with a 90 degree phase shift between the two clocks). The first phase of the clock uses the CLK input of the device and the second phase uses the device's CKE input.

13 Claims, 10 Drawing Sheets

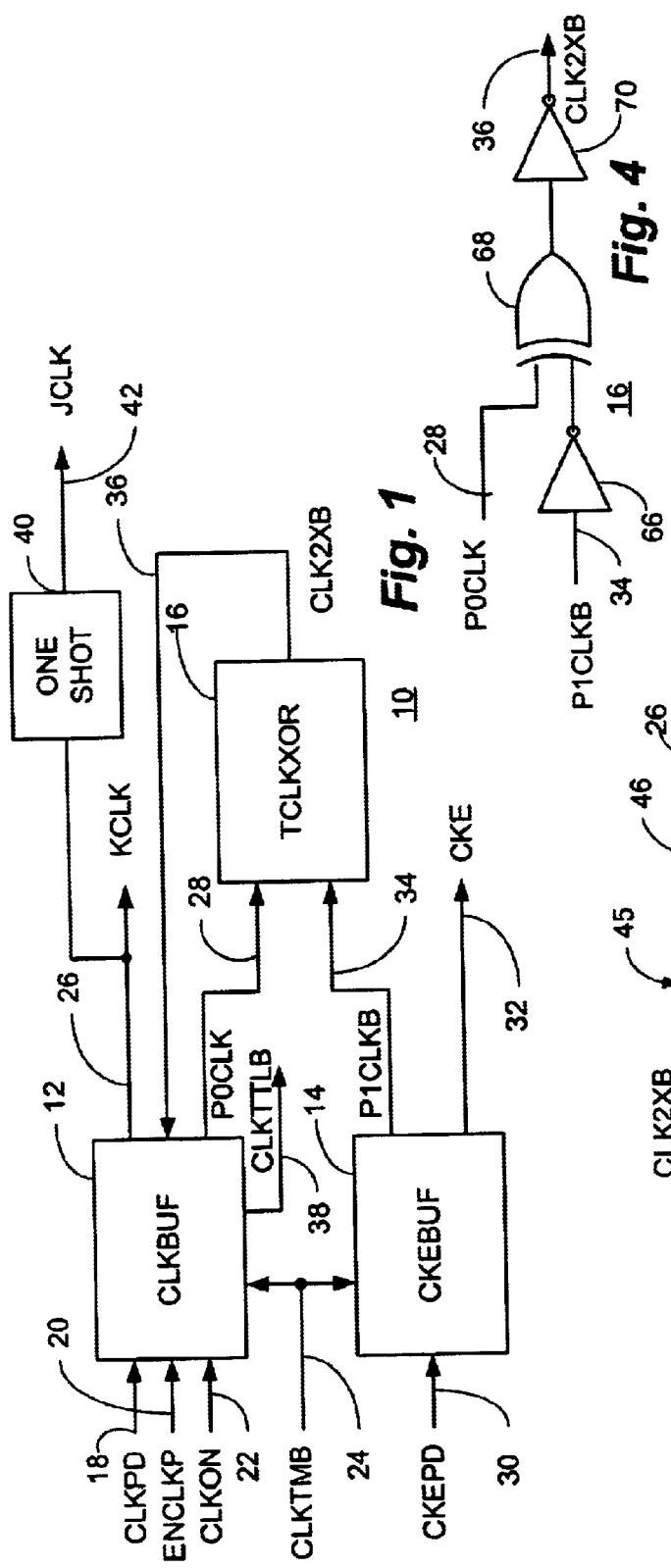

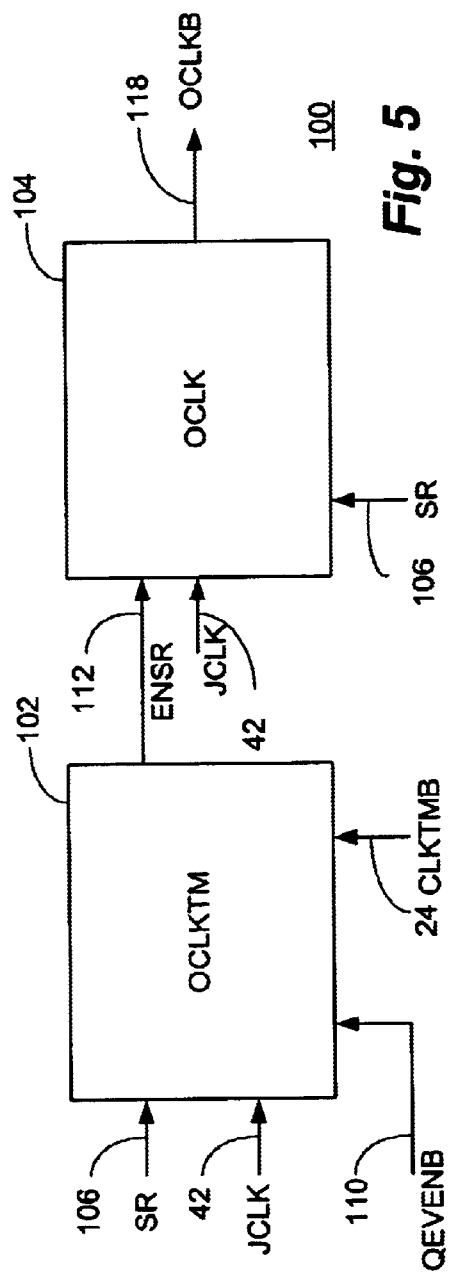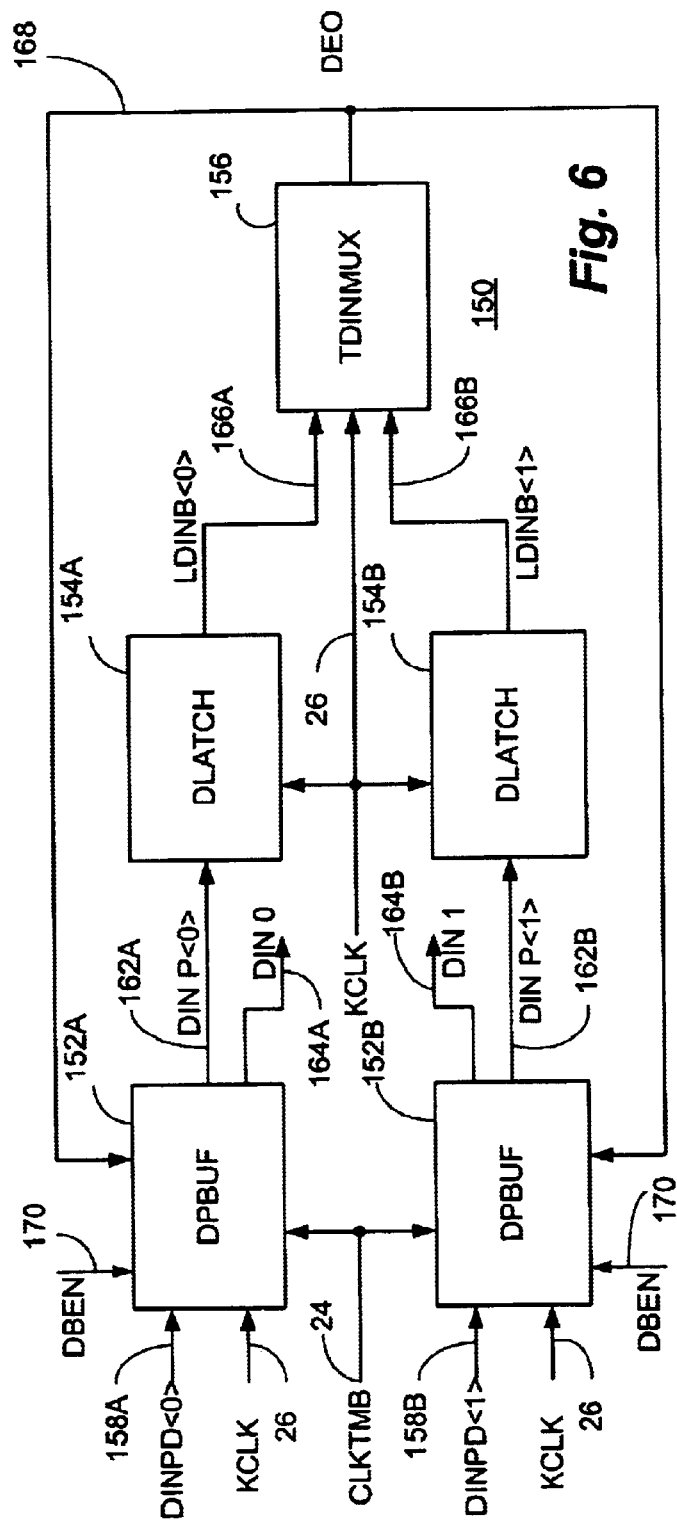

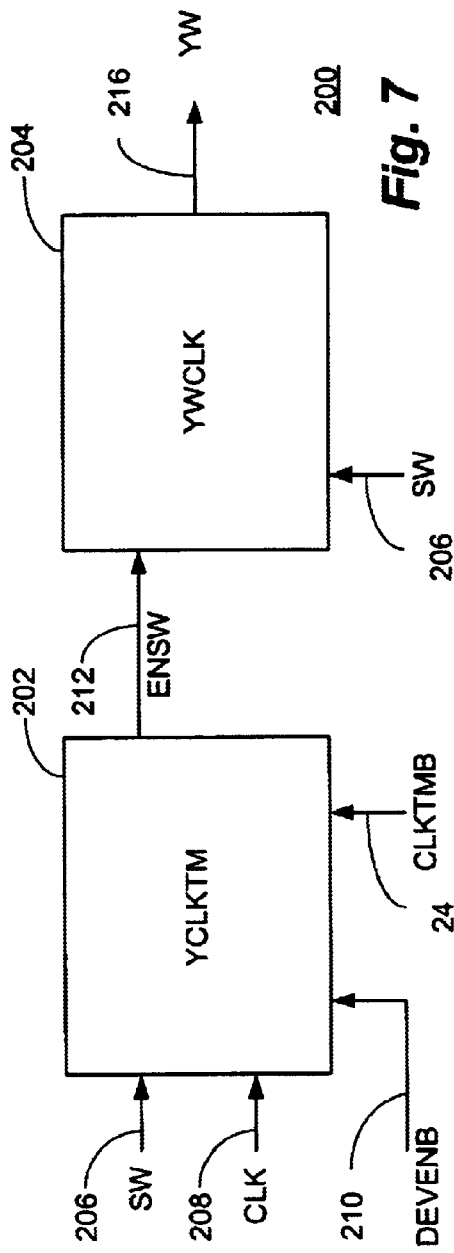
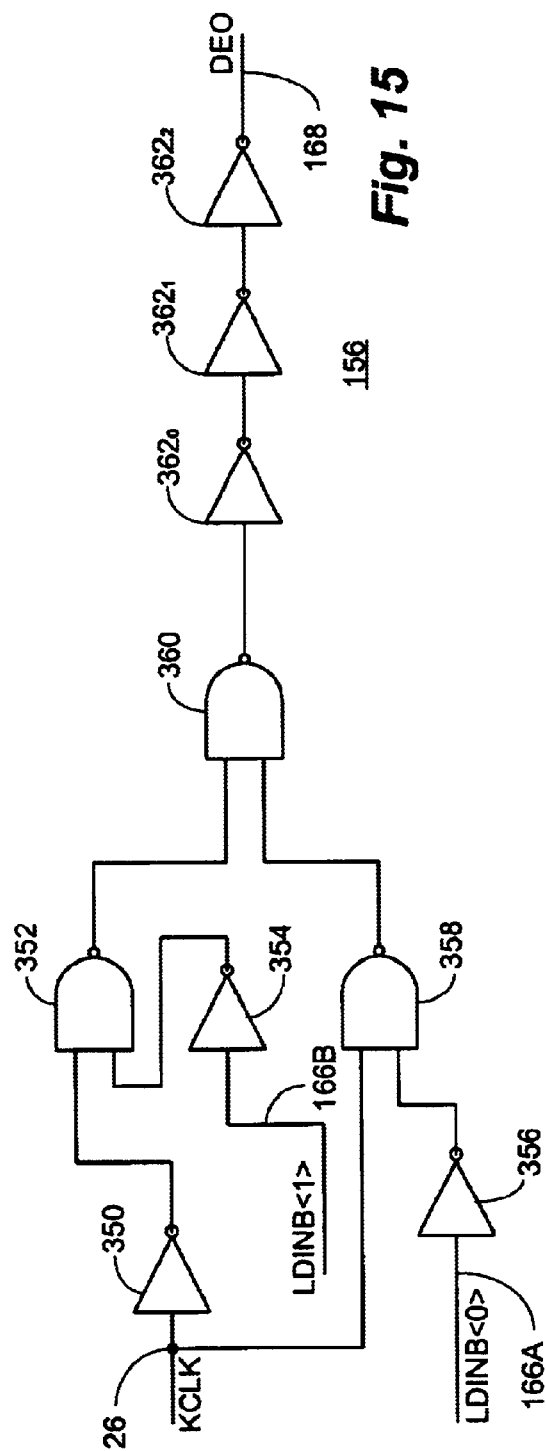

152

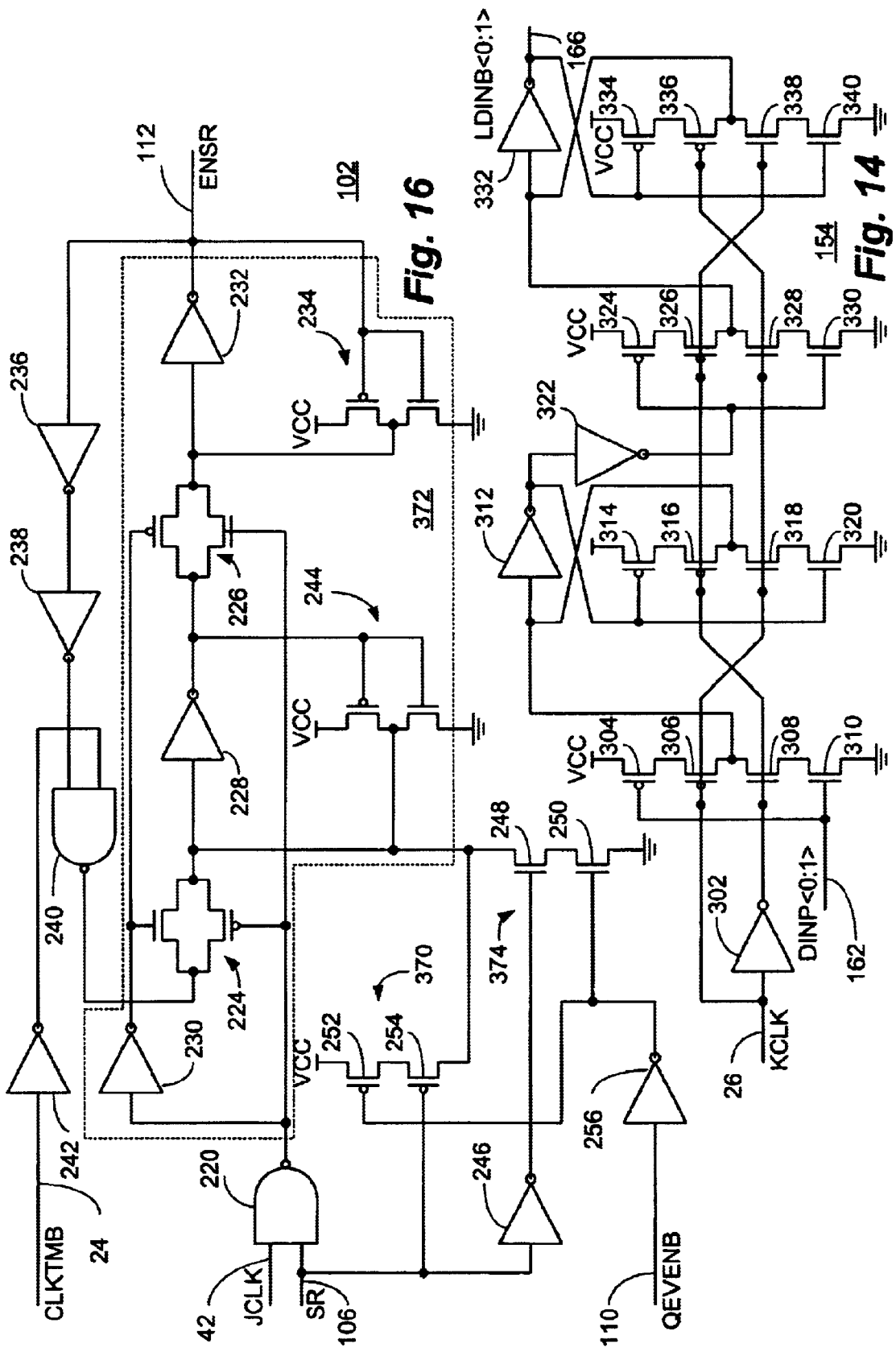

SYSTEM AND METHOD FOR HIGH SPEED INTEGRATED CIRCUIT DEVICE TESTING UTILIZING A LOWER SPEED TEST ENVIRONMENT

CROSS REFERENCE TO RELATED PATENT APPLICATIONS

The present invention is related to the subject matter disclosed in U.S. Patent application Ser. No. 09/815,147 for: "Time Data Compression Technique for High Speed Integrated Circuit Memory Devices" assigned to Mosel Vitelic, Inc., assignee of the present invention, the disclosure of which is herein specifically incorporated by this reference.

BACKGROUND OF THE INVENTION

The present invention relates, in general, to the field of systems and methods for high speed integrated circuit ("IC") testing. More particularly, the present invention relates to a low cost system and method for wafer probe testing of semiconductor IC devices at a high on-chip rated speed while input and output signals to the device may be operated at a relatively slower rate.

Current techniques for testing ICs are implemented using various techniques such as output data compression, the simultaneous probing of multiple die, on-chip state machines to allow functional testing of circuit subcircuits through built in self test ("BIST") and the like. However, none of the known methods provide a means for device testing at multiples of the input test signal rates. In this regard, there is currently no known technique for testing an integrated circuit device at its maximum operating frequency with a probe stimulus lower than the operating frequency of the device itself.

High speed integrated circuit memory devices can be particularly difficult to test. Often, clock rates or input/output ("I/O") signal rates for high speed memories exceed the capabilities of production and engineering automatic test equipment. State-of-the-art test equipment performance is usually dictated by near-term performance of high volume commodity memories.

Special high speed memory products targeted for graphics applications and other specialty high speed markets often push production testers beyond their limits. The emergence of very high speed embedded memories that interface to other on-chip circuitry to operate at speeds of from two to four times faster than commodity high volume memories using the same process and layout technologies has resulted in an even greater disparity between memory speed and tester capability. Even synchronous dynamic random access memory ("SDRAM") and double data rate ("DDR") SDRAMs are designed for operation at constantly faster clock frequencies thereby requiring fast, high cost testers to test these commodity DRAM devices. Further, it is almost always the case that the frequency at which these devices can be tested using wafer probes is considerably lower than that at which the device must be guaranteed to operate.

SUMMARY OF THE INVENTION

The present invention advantageously provides a system and method for low cost testing of integrated circuit devices at their rated speed during wafer probe testing. This enables the device to be operated at its rated speed while input signals to, and output signals from, the device may be operated at a lower speed. Through the technique disclosed herein, a method is provided that enables integrated circuit devices (e.g. memory devices) to be tested at an operational speed faster than that of the test environment itself. This then allows relatively lower cost, lower speed test equipment to be used to test high speed devices and enables devices to be operated at their maximum rated frequency during wafer probe testing.

In an exemplary embodiment of the present invention disclosed herein, a wafer probe signal is used to enable a test function of the device. The test function uses multiple input signals (e.g. pad input signals) to generate on-chip clock signals that are multiples of the input signal rates. Additionally, multiple input signals (e.g. pad input signals) are used to capture data input and accelerate the data rate to the specified data rate of the device where the frequency of the data in on the chip operates at multiples of the data in frequency. In an alternative embodiment, a method is provided that selectively writes either even or odd data internally, while the write timing for the on-chip write is executed at the specified cycle time. Output data may also be selectively outputted (even/odd) at a rate slower than that occurring on the device itself where the output data rate is sufficiently reduced such that an automatic tester can receive and test the output data.

As disclosed herein, the system and method of the present invention may be implemented by means of added on-chip circuitry that interfaces between a memory device and the external test environment. Specifically, the added circuitry can include some or all of the following: a) a method for enabling/disabling the test mode through the use of a program register, special control signal entry or, preferably, the use of a probe pad; b) a clock rate multiplier (e.g. a clock doubler); c) a data-in rate multiplier; d) a data-in selector for reduced write rate; e) broadside state writing (e.g. especially applicable with wide I/O devices; f) a data-out selector for data rate reduction to the device input/output ("I/O") pads; and g) data-out compression at a 2× rate with output rate reduction to a 1× rate (e.g. an input-external-clock rate).

In the exemplary embodiment disclosed, a probe pad is used to enable a special test mode. When enabled, the on-chip clock generator enables a clock frequency doubler. The frequency doubler generates a 2× frequency clock from the 1× frequency external clock signals (two 1× clock phases with a 90 degree phase shift between the two clocks). The first phase of the clock uses the CLK input of the device and the second phase uses the device's CKE input. When in a test mode, the clock suspends any other functions requiring CKE and the CKE input becomes the second phase clock input.

The data-out function operates at a 1× rate and on-chip circuitry selectively outputs data on an every-other basis of the 2× rate internal clock which results in a 1× data out rate. "Even" or "odd" data groupings are selected by either an additional probe pad or by multiplexing the test mode input selection (even/odd) on an external input pad such as "chip select" ("CS") or a similar method may be employed as indicated with respect to the device CKE input as described above.

Either of two different methods may be employed in implementation of a data-in function:

1) A 2× Data Method—A data accelerating method using two different data inputs and a data multiplexer switched by the 2× clock generates the 2× internal data. The output of the 2× data accelerator is used for two or more input data buses.

2) A 1× Data Method—A method similar to the data-out rate reduction is used for data-in wherein all of the internal data buses run at full speed (e.g. 2× frequency) but data is written to every other address location based on the even/odd input/output selector control signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a representative functional block diagram of a clock circuit in accordance with a representative embodiment of the present invention for inclusion on-chip with an integrated circuit device, such as a memory device;

FIG. 2 is a more detailed logic block diagram of the CLKBUF circuit illustrated in the preceding figure;

FIG. 3 is a more detailed logic block diagram of the CKEBUF circuit illustrated in FIG. 1;

FIG. 4 is a more detailed logic block diagram of the TCLKXOR circuit also illustrated in FIG. 1;

FIG. 5 is a representative functional block diagram of a data-out clock circuit in accordance with a representative embodiment of the present invention for inclusion on-chip with an integrated circuit device;

FIG. 6 is a representative functional block diagram of a data-in circuit in accordance with a representative embodiment of the present invention for implementation of a 2× data rate method as disclosed herein;

FIG. 7 is a representative functional block diagram of an alternative data-in circuit in accordance with another representative embodiment of the present invention for implementation of a 1× data rate method as disclosed herein;

FIG. 12 is also a more detailed logic block diagram of the OCLK circuit of FIG. 5;

FIG. 14 is also a more detailed schematic illustration of one of the two DLATCH circuits previously illustrated and utilized in the data-in circuit of FIG. 6;

FIG. 15 is an additional more detailed schematic illustration of the TDINMUX circuit previously illustrated and utilized in the data-in circuit of FIG. 6;

FIG. 16 is a detailed schematic illustration of the OCLKTM circuit previously illustrated in FIGS. 5 and 11.

DESCRIPTION OF A REPRESENTATIVE EMBODIMENT

Figure 8:
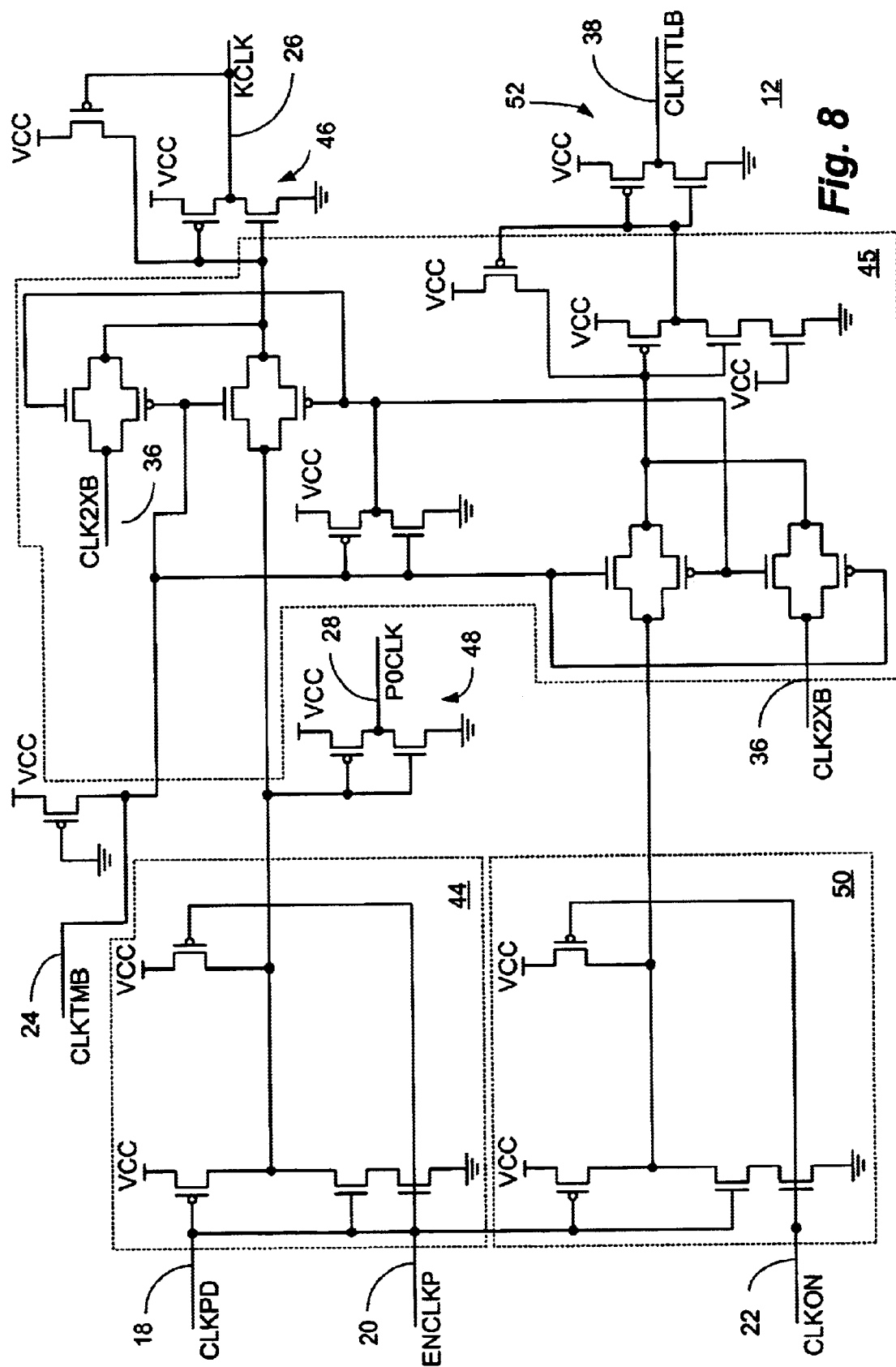
FIG. 8 is a more detailed schematic illustration of the CLKBUF circuit of FIGS. 1 and 2 implemented utilizing complementary metal oxide semiconductor ("CMOS") technology.

With reference now to FIG. 1, a representative functional block diagram of a clock circuit 10 in accordance with a representative embodiment of the present invention is shown for inclusion on-chip with an integrated circuit device, such as a memory device. The clock circuit 10 comprises, in pertinent part, a clock buffer ("CLKBUF") circuit 12, a clock enable buffer ("CKEBUF") circuit 14 and a T clock XOR ("TCLKXOR") circuit 16. The CLKBUF circuit 12 receives a clock pad ("CLKPD") signal on line 18, an enable clock pad ("ENCLKP") signal on line 20 and a clock on ("CLKON") signal on line 22 in addition to a CLKTM bar ("CLKTMB") signal on line 24. The CLKTMB signal is also input to CKEBUF circuit 14 as well as a CKE pad ("CKEPD") signal on line 30.

The CLKBUF circuit 12 provides a K clock ("KCLK") signal on line 26, a phase zero clock ("P0CLK") signal on line 28 To TCLKXOR circuit 16 and a clock transistor-transistor logic bar ("CLKTTLB") signal on line 38. The CKEBUF circuit 14 produces a phase 1 clock bar ("P1CLKB") signal on line 34 for input to TCLKXOR circuit 16 and also supplies the standard clock enable ("CKE") signal on line 32 to subsequent integrated circuit device circuitry. The TCLKXOR circuit 16 produces a clock 2× bar ("CLK2XB") signal on line 36 which is fed back to CLKBUF circuit 12. As shown, the KCLK signal on line 26 is passed through a "one shot" circuit 40 to provide the device J clock ("JCLK") signal on line 42.

With reference additionally now to FIG. 2, a more detailed logic block diagram of the CLKBUF circuit 12 illustrated in the preceding figure is shown. The CLKPD and ENCLKP signals on lines 18 and 20 respectively are input to a two input NAND gate 44 which has its output coupled to the input of an inverter 48 to provide the P0CLK signal on line 28. The output of the NAND gate 44 is also alternatively supplied (with the CLK2XB signal on line 36) to the input of an inverter 46 to provide the KCLK signal on line 26 as selected by the CLKTMB signal on line 24 through means of a switching circuit 45.

An additional two input NAND gate 50 has its inputs coupled to receive the CLKPD signal on line 18 and the CLKON signal on line 22. The output of the NAND gate 50 is alternatively supplied (with the CLK2XB signal on line 36) to the input of an inverter 52 to supply the CLKTTLB signal on line 38 as selected by the CLKTMB signal on line 24 through means of the switching circuit 45.

With reference additionally now to FIG. 3, a more detailed logic block diagram of the CKEBUF circuit 14 illustrated in FIG. 1 is shown. The CKEBUF circuit 14 comprises an inverter 54 coupled to receive the CKEPD signal on line 30. The output of the inverter 54 is coupled through an inverter 56 to the input of another inverter 58 to supply the P1CLKB signal on line 34. The output of the inverter 56 is also coupled to one input of a two input OR gate 60 which has its output coupled through an additional inverter 64 to provide the CKE signal on line 32. The CLKTMB signal on line 24 is inverted by means of inverter 62 and supplied as another input to the OR gate 60.

With reference additionally now to FIG. 4, a more detailed logic block diagram of the TCLKXOR circuit 16 also illustrated in FIG. 1 is shown. The TCLKXOR circuit 16 includes an inverter 66 which has, as it input, the P1CLKB signal on line 34. The output of the inverter 66 is supplied as one input to a two input exclusive OR ("XOR") gate 68 which has, as its other input, the P0CLK signal on line 28. Output of the XOR gate 68 is inverted through inverter 70 to provide the CLK2XB signal on line 36.

With reference additionally now to FIG. 5, a representative functional block diagram of a data-out clock circuit 100 in accordance with a representative embodiment of the present invention is shown for possible inclusion on-chip with an integrated circuit device. The circuit 100 comprises, in pertinent part, an output clock TM ("OCLKTM") circuit 102 and an associated output clock ("OCLK") circuit 104. The OCLKTM circuit 102 receives as inputs the JCLK signal on line 42, the CLKTMB signal on line 24 as well as a shifted read ("SR") signal on line 106 and a data output ("Q") even ("QEVEN") signal on line 110. The OCLKTM circuit 102 then provides an enable shifted read ("ENSR") signal on line 112 for input to the OCLK circuit 104. The OCLK circuit 104 also receives the SR signal on line 106 as well as the JCLK signal on line 42 to provide an output clock bar ("OCLKB") signal on line 118.

With reference additionally now to FIG. 6, a representative functional block diagram of a data-in circuit 150 in accordance with a representative embodiment of the present invention is shown for implementation of a 2x data rate method as disclosed herein. The circuit 150 comprises, in pertinent part, a pair of data pad buffer ("DPBUF") circuits 152A and 152B, a corresponding pair of data latch ("DLATCH") circuits 154A and 154B and a common T data in multiplexer ("TDINMUX") circuit 156.

The DPBUF circuits 152A and 152B each receive a DBEN signal on line 170 as well as the CLKTMB signal on line 24 and the KCLK signal on line 26. The DPBUF circuit 152A is coupled to receive a first data input pad ("DINPD<0>") signal from an external bond pad on line 158A while the DPBUF circuit 152B is coupled to receive a second data input pad ("DINPD<1>") signal from an external bond pad on line 158B. The DPBUF circuit 152A provides data in signals DIN P<0> on line 162A and a DIN 0 signal on line 164A. In like manner, the DPBUF circuit 152B provides data in signals DIN P<1> on line 162B and a DIN 1 signal on line 164B.

The DIN P<0> signal on line 162A and the DIN P<1> signal on line 162B are respectively furnished to the DLATCH circuits 154A and 154B which also each receive the KCLK signal on line 26. The KCLK signal on line 26 as well as the LDINB<0>signal output of DLATCH circuit 154A on line 166A and the LDINB<1> signal output of DLATCH circuit 154B on line 166B are supplied as inputs to the TDINMUX circuit 156. The TDINMUX circuit 156 then supplies a data enable output ("DEO") signal on line 168 which is fed back to DPBUF circuits 152A and 152B.

With reference additionally now to FIG. 7, a representative functional block diagram of an alternative data-in circuit 200 in accordance with another representative embodiment of the present invention is shown for implementation of a 1x data rate method as disclosed herein. The circuit 200 comprises, in pertinent part, a Y clock timing ("YCLKTM") circuit 202 and a corresponding Y write clock ("YWCLK") circuit 204. The YCLKTM circuit 202 receives a shifted write ("SW") signal on line 206, a clock ("CLK") signal on line 208 and a data input even bar ("DEVENB") signal on line 210 in addition to the CLKTMB signal on line 24. An enable shifted write ("ENSW") signal on line 212 is input to the YWCLK circuit 204 from the YCLKTM circuit 202. The YWCLK circuit 204 also receives the SW signal on line 206 and provides a Y write ("YW") signal on output line 216.

With reference additionally now to FIG. 8, a more detailed schematic illustration of the CLKBUF circuit 12 of FIGS. 1 and 2 is shown implemented utilizing complementary metal oxide semiconductor ("CMOS") technology. In this view, a gate level illustration of the NAND gates 44 and 50 are shown as well as that of the various inverters 46, 48 and 52. The switching circuit 45, operative for selectively applying either the CLK2XB signal on line 36 or the outputs of the NAND gates 44 and 50 to the respective inputs of the inverters 46 and 52, is shown in greater detail as it operates in response to the CLKTMB signal on line 24.

Figure 9:
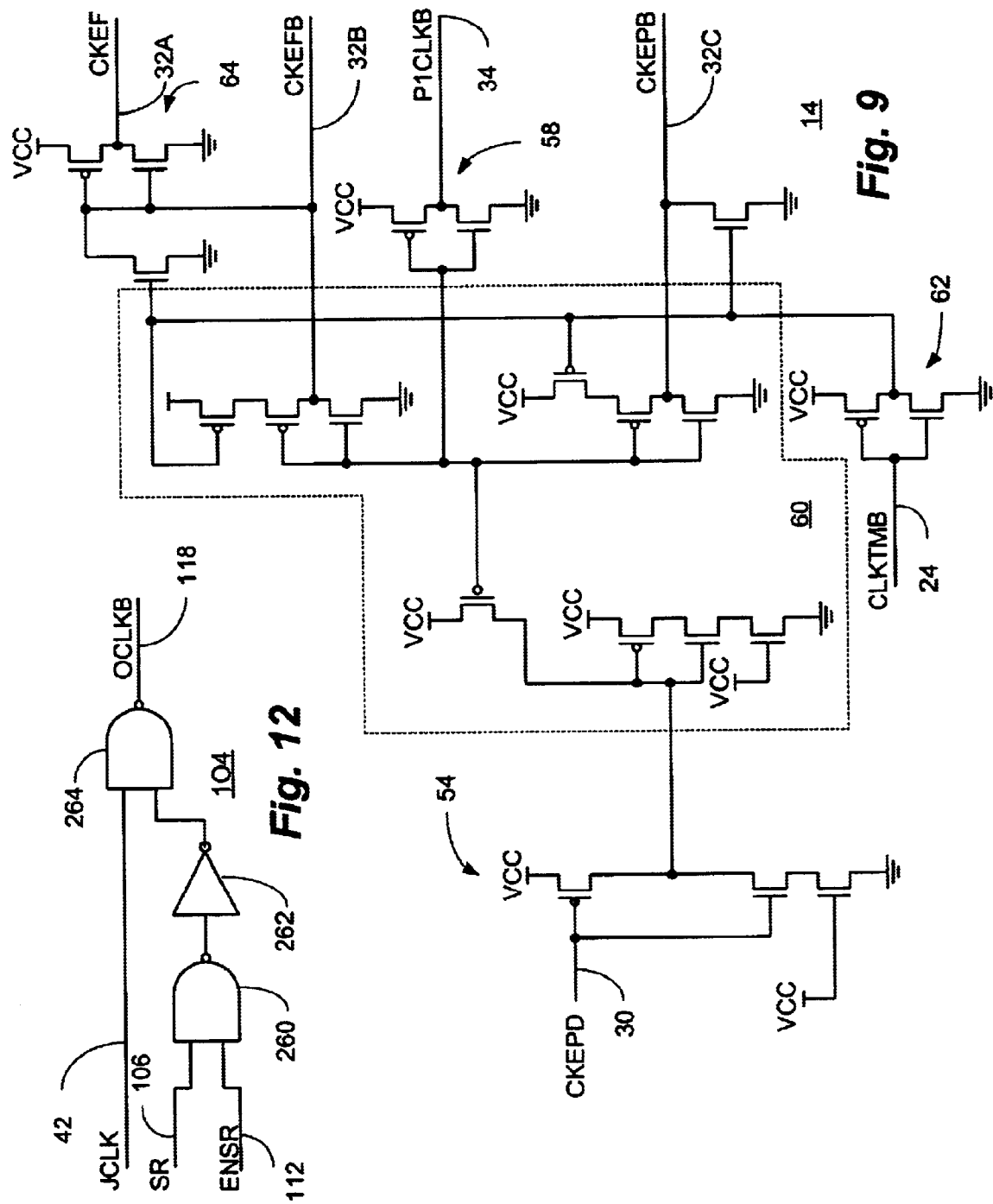
FIG. 9 is also a more detailed schematic illustration of the CKEBUF circuit of FIGS. 1 and 3 also implemented utilizing CMOS technology.

With reference additionally now to FIG. 9, a more detailed schematic illustration of the CKEBUF circuit 14 of FIGS. 1 and 3 is shown also implemented utilizing CMOS technology. In this view, a gate level illustration of the OR gate 60 and the associated inverters shown in FIG. 3 is provided. The CKEPD signal on line 30 and the CLKTMB signal on line 24 provide inputs to the CKEBUF circuit 14 to provide a number of CKE signal related outputs: CKEF on line 32A; its complement CKEFB on line 32B and CKEPB on line 32C as well as P1CLKB on line 34.

Figure 10:
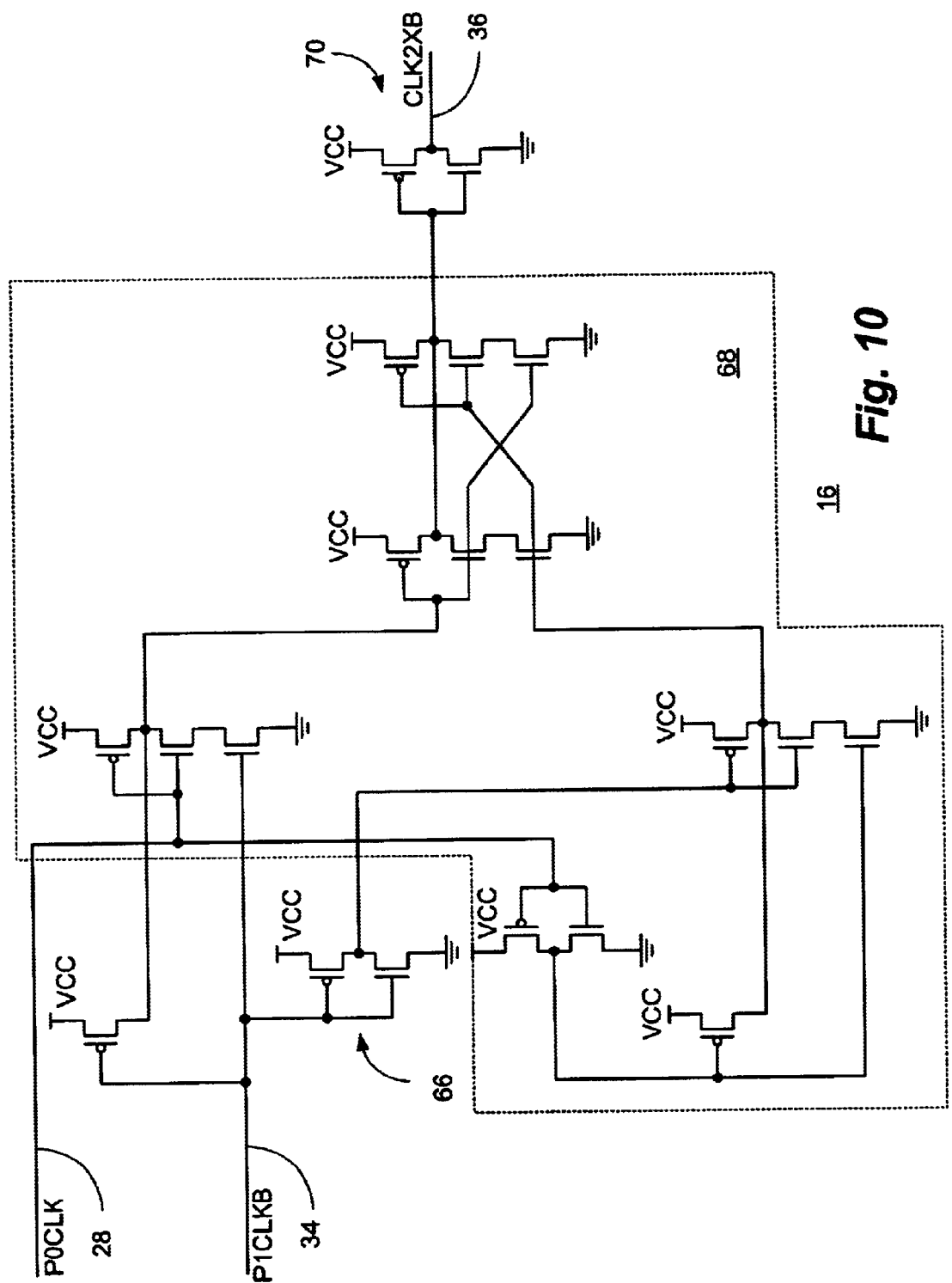
FIG. 10 is an additional detailed schematic illustration of the TCLKXOR circuit of FIGS. 1 and 4 also implemented utilizing CMOS technology.

With reference additionally now to FIG. 10, an additional detailed schematic illustration of the TCLKXOR circuit 16 of FIGS. 1 and 4 is shown also implemented utilizing CMOS technology. In this view, a gate level illustration of the XOR gate 68 is shown along with the input inverter 66 and the output inverter 70 which furnishes the CLK2XB signal on line 36 in response to the P0CLK and P1CLKB signals on input lines 28 and 34 respectively.

Figure 11:
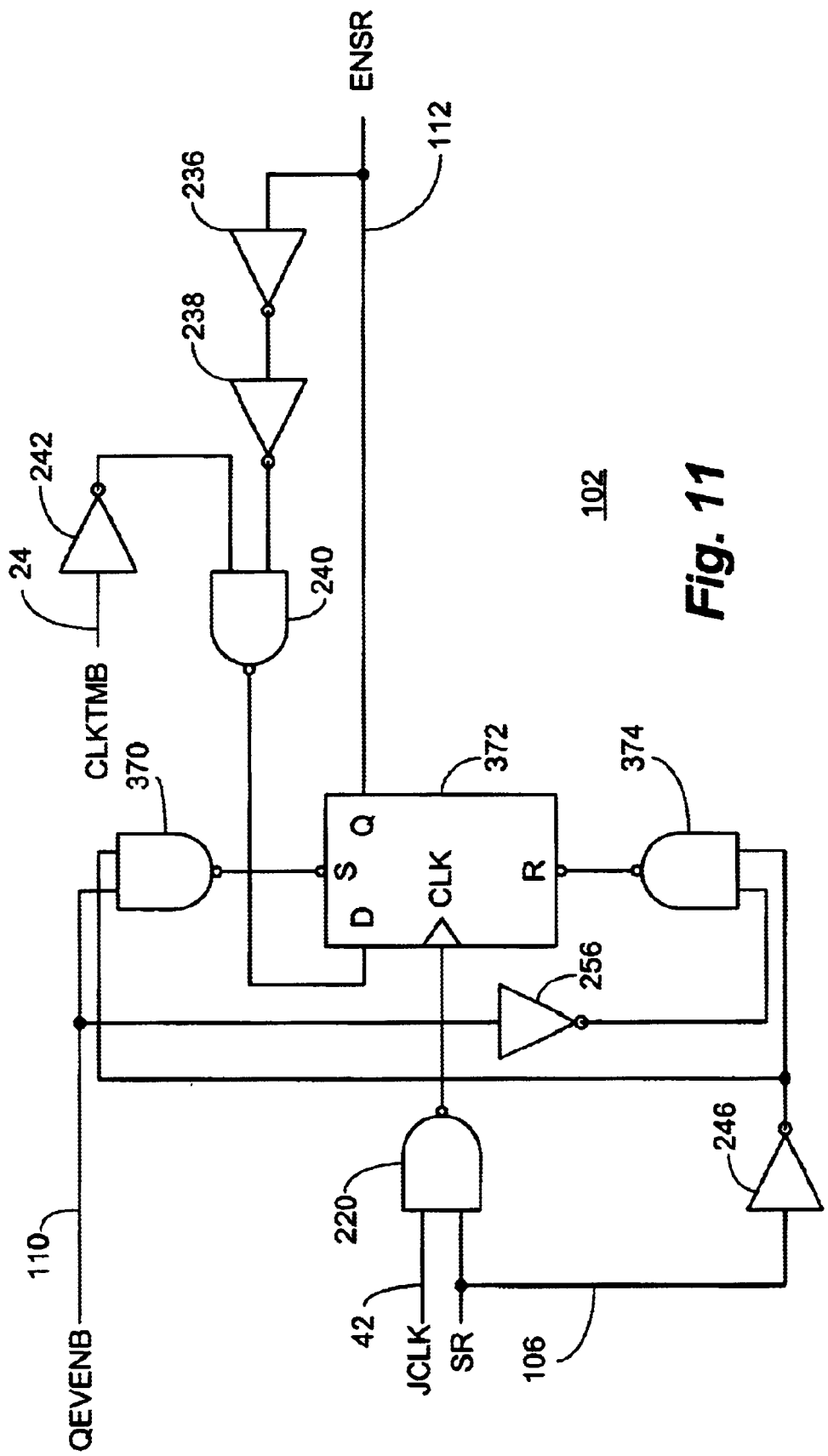
FIG. 11 is a more detailed logic block diagram of the OCLKTM circuit of FIG. 5.

With reference additionally now to FIG. 11, a more detailed logic block diagram of the OCLKTM circuit 102 of FIG. 5 is shown. The OCLKTM circuit 102 receives as inputs the JCLK signal on line 42 and the SR signal on line 106 which are provided as inputs to a two input NAND gate 220 as shown. The SR signal on line 106 is also provided through an inverter 246 to one of the inputs of an additional pair of two input NAND gates 370, 374 which have their outputs connected to the set ("S") and reset ("R") inputs respectively of a register 372. The other input of the NAND gate 370 is coupled to receive the QEVENB signal on line 110, which signal is inverted through inverter 256 to be coupled to the other input of the NAND gate 374. Output of the NAND gate 220 is coupled to the clocking input of the register 372.

The CLKTMB signal on line 24 is coupled through an inverter 242 to one input of another two input NAND gate 240 which has its output coupled to the data input ("D") of the register 372. The data output ("Q") of the register 372 is coupled to provide the ENSR signal on line 112 which is coupled back to the other input of the NAND gate 240 through series connected inverters 236 and 238.

With reference additionally now to FIG. 12, a more detailed logic block diagram of the OCLK circuit 104 of FIG. 5 is shown. The OCLK circuit 104 comprises, in pertinent part, a first two input NAND gate 260 which has its output coupled to one input of a second two input NAND gate 264 through an inverter 262. The SR signal on line 106 and the ENSR signal on line 112 are provided as inputs to the first NAND gate 260 and the JCLK signal on line 42 is connected to the remaining input of the second NAND gate 264. The output of the NAND gate 264 provides the OCLKB signal on line 118.

Figure 13:
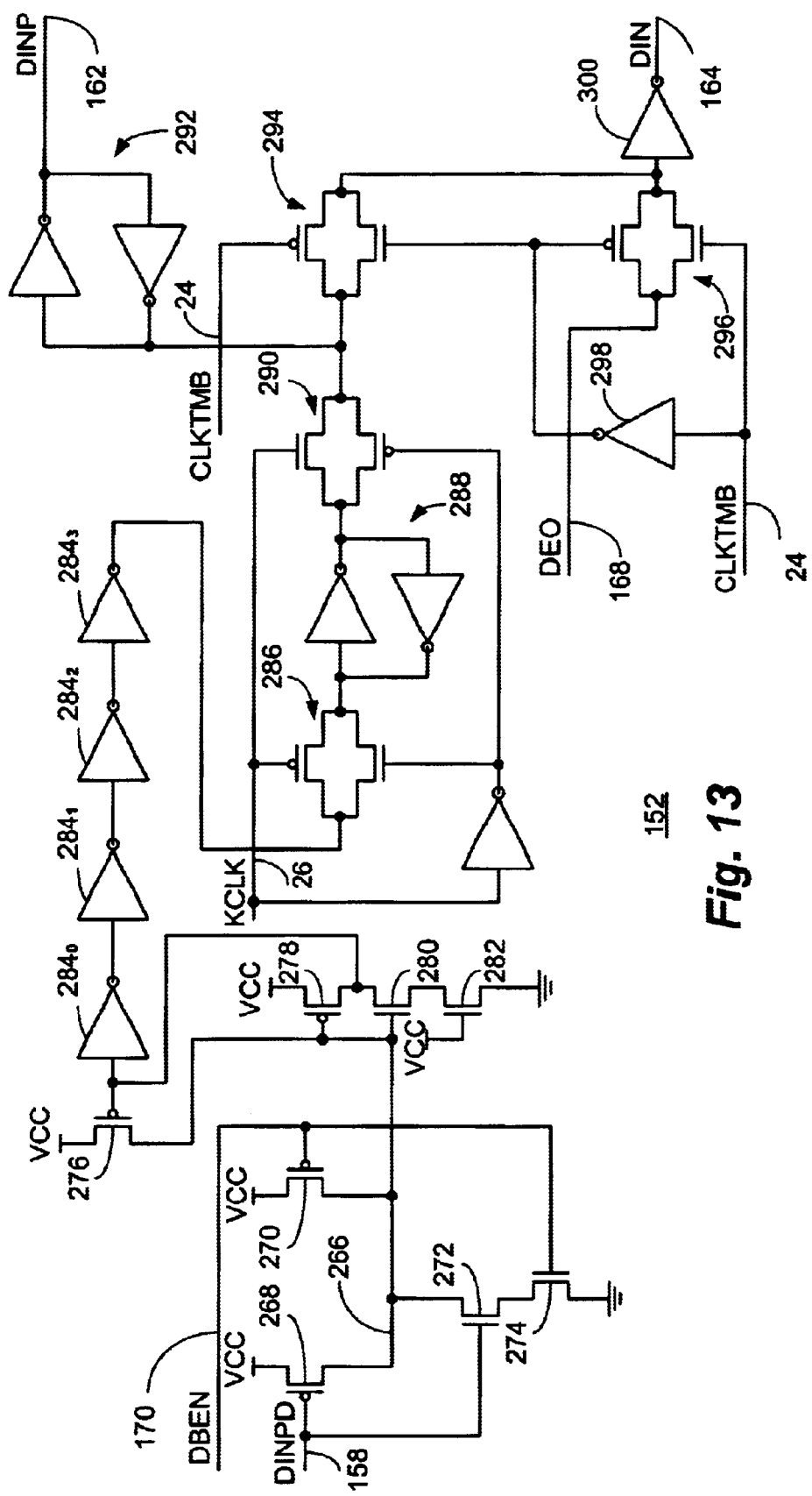
FIG. 13 is a more detailed schematic illustration of one of the two DPBUF circuits previously illustrated and utilized in the data-in circuit of FIG. 6.

With reference additionally now to FIG. 13, a more detailed schematic illustration of one of the two DPBUF circuits 152A and 152B is shown as previously illustrated and utilized in the data-in circuit 150 of FIG. 6. The DPBUF circuits 152A and 152B receive as inputs the DBEN signal on line 170, the DINP<0> and DINP<1> signals on lines 158A and 158B respectively as well as the CLKTMB signal on line 24 and the DEO output signal from the TDINMUX circuit 156 (FIG. 6) on line 168.

The DINPD signals on line 158 are supplied to the gate terminal of a P channel transistor 268 and the gate of an N channel transistor 272 coupled in series with N channel transistor 374 between one terminal of P channel transistor 268 defining a circuit node 266 and circuit ground. An additional P channel transistor 270 is coupled in parallel with P channel transistor 268 between VCC and the circuit node 266 and receives as input the DBEN signal on line 170 as is also coupled to the gate terminal of N channel transistor 274. Another P channel transistor 276 is coupled between VCC and the circuit node 266. Series connected P channel transistor 278 and N channel transistors 280 and 282 are coupled between VCC and circuit ground. The gates of transistors 278 and 280 are coupled to the circuit node 266 and the gate of transistor 282 is coupled to VCC. The output node intermediate transistors 278 and 280 is coupled to the gate of transistor 276 and to the input of a series connected string of inverters $284_0$ through $284_3$ inclusive.

Output from inverter $284_3$ is coupled to a transmission gate 286 which has its output coupled through a latch circuit 288 to the input of another transmission gate 290. The KCLK signal on line 26 is coupled to the gate of the P channel device of transmission gate 286 and to the gate of the N channel device of transmission gate 290. The complement of the KCLK signal on line 26 is inverted and applied to the gate of the N channel device of transmission gate 286 and to the gate of the P channel device of transmission gate 290. Output of the transmission gate 290 is coupled through a latch circuit 292 to the DINP signal line 162 as well as to the input of an additional transmission gate 294 which has the gate of its P channel device coupled to receive the CLKTMB signal on line 24.

The DEO signal on line 168 is coupled to the input of a transmission gate 296 which has the gate of its N channel device coupled to receive the CLKTMB signal on line 24 and the gate of its P channel device coupled to receive its complement through inverter 298. The output of the inverter 298 is also coupled to the gate of the N channel device of the transmission gate 294. The outputs of the transmission gates 294 and 296 are coupled together to the input of an inverter 300 which supplies the DIN signal on line 164.

With reference additionally now to FIG. 14, a more detailed schematic illustration of one of the two DLATCH circuits 154A and 154B is shown as previously illustrated and utilized in the data-in circuit 150 of FIG. 6. The DLATCH circuits 154A and 154B receive the DIN P<0> and DIN P<1> signals on lines 162A and 162B from the DPBUF circuits 152A and 152B respectively as well as the KCLK signal on line 26. The KCLK signal on line 26 is coupled to the input of an inverter 302 as shown.

A series connected string of P channel transistors 304 and 306 and N channel transistors 308 and 310 are coupled between VCC and circuit ground. The DINP signal on line 162 is coupled to the gates of transistors 304 and 310 while the KCLK signal on line 26 is supplied to the gate terminal of transistor 306 and its complement supplied to the gate terminal of transistor 308 through the inverter 302. An output node intermediate transistors 306 and 308 is coupled to the input of an inverter 312.

Another series connected string of P channel transistors 314 and 316 and N channel transistors 318 and 320 are coupled between VCC and circuit ground. The output of the inverter 312 is coupled to the gates of transistors 314 and 320 while the KCLK signal on line 26 is supplied to the gate terminal of transistor 318 and its complement supplied to the gate terminal of transistor 316 through the inverter 302. An output node intermediate transistors 316 and 318 is coupled to the input of an inverter 312. An additional inverter 322 is coupled to the output of the inverter 312.

An additional series connected string of P channel transistors 324 and 326 and N channel transistors 328 and 330 are coupled between VCC and circuit ground. The output of the inverter 322 is coupled to the gates of transistors 324 and 330 while the KCLK signal on line 26 is supplied to the gate terminal of transistor 328 and its complement supplied to the gate terminal of transistor 326 through the inverter 302. An output node intermediate transistors 326 and 328 is coupled to the input of an inverter 332 which provides one of the output signals LDINB<0:1> on line 166.

A final series connected string of P channel transistors 334 and 336 and N channel transistors 338 and 340 are coupled between VCC and circuit ground. The output of the inverter 332 on line 166 is coupled to the gates of transistors 334 and 340 while the KCLK signal on line 26 is supplied to the gate terminal of transistor 336 and its complement supplied to the gate terminal of transistor 338 through the inverter 302. An output node intermediate transistors 336 and 338 is coupled to the input of the inverter 332.

With reference additionally now to FIG. 15, an additional, more detailed schematic illustration of the TDINMUX circuit 156 is shown as previously illustrated and utilized in the data-in circuit 150 of FIG. 6. The TDINMUX circuit 156 receives the LDINB<0> and LDINB<1> signals output from the DLATCH circuits 154A and 154B on lines 166A and 166B respectively as well as the KCLK signal on line 26. The DEO output signal on line 168 is fed back to both of the DPBUF circuits 152A and 152B as shown in FIGS. 6 and 13.

The KCLK signal on line 26 is coupled to the input of an inverter 350 and to one input of a two input NAND gate 358. The output of the inverter 350 is coupled to one input of another two input NAND gate 352. The LDINB<0> signal on line 166A is coupled through an inverter 356 to the other input of the NAND gate 358 while the LDINB<1> signal on line 166B is coupled through an inverter 354 to the other input of the NAND gate 352. The outputs of the NAND gates 352 and 358 are coupled to respective inputs of an additional two input NAND gate 360. Output of the NAND gate 360 is coupled through a series connected strings of inverters $362_0$ through $362_2$ to provide the DEO output signal on line 168.

With reference additionally now to FIG. 16, a detailed schematic illustration of the OCLKTM circuit 102 previously illustrated in FIGS. 5 and 11 is shown. The JCLK signal on line 42 and the SR signal on line 106 are supplied as inputs to the NAND gate 220 as previously described and shown. A series connected string of P channel transistors 252 and 254 with N channel transistors 248 and 250 are coupled between VCC and circuit ground and comprise the NAND gates 370 and 374 previously illustrated in FIG. 11. The SR signal on line 106 is coupled to the gate of transistor 254 while its complement is supplied to the gate terminal of transistor 248 through inverter 246. The QEVENB signal on line 110 is supplied through inverter 256 to the gate terminals of transistors 252 and 250.

Output of the NAND gate 220 is supplied to the clock input of the register 372 as shown. The register 372 comprises, in pertinent part a transmission gate 224, a latch circuit comprising cross coupled inverters, 228 and 244, an additional transmission gate 226 and another latch circuit comprising cross coupled inverters 232 and 234. The "Q" output of the register 372 is coupled to supply the ENSR signal on line 112. The output of the NAND gate 220 is coupled to the gate of the P channel device of the transmission gate 224 and the gate of the N channel device of the transmission gate 226. Its complement is provided through inverter 230 to the gate of the N channel device of the transmission gate 224 and the gate of the P channel device of the transmission gate 226. As previously described with respect to FIG. 11, the output of the NAND gate 240 is coupled to the "D" input of the register 372.

Figure 17A:
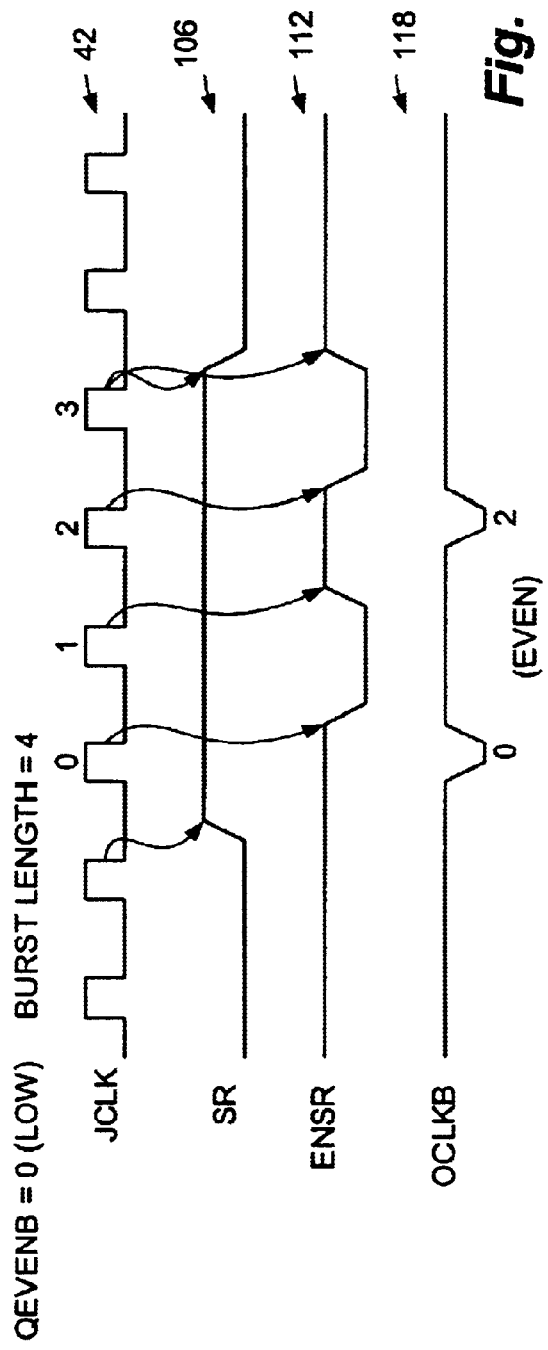
FIGS. 17A and 17B are simplified timing diagrams illustrating the interrelationship of the JCLK, SR, ENSR and OCLKB signals for the data-out clock circuit of FIG. 5 when the QEVENB signal thereof is both logic level "low" and "high" respectively and with a burst length of four.
Figure 17B:
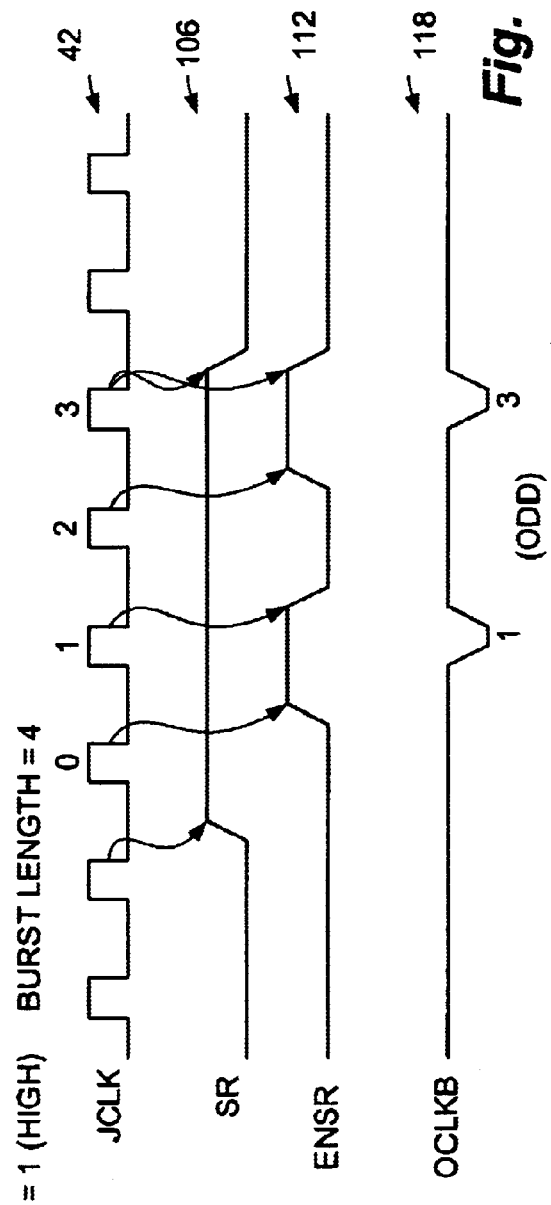

With reference additionally now to FIGS. 17A and 17B, simplified timing diagrams illustrating the interrelationship of the JCLK 42, SR 106, ENSR 112 and OCLKB 118 signals are shown for the data-out clock circuit 100 of FIG. 5 when the QEVENB signal 110 thereof is both at a logic level "low" and "high" respectively and with a burst length of four. The OCLKTM circuit 102 receives the JCLK signal (produced from the device KCLK signal as shown in FIG. 1) on line 42 and the SR signal on line 106. Details of the OCLKTM circuit are shown in FIGS. 11 and 16 and it provides the ENSR signal on line 112 for input to the OCLK circuit 104 as shown in greater detail in FIG. 12. The OCLK circuit 104 provides the OCLKB signal on line 118 in response to the ENSR signal on line 112, the JCLK signal on line 42 and the SR signal on line 106.

While there have been described above the principles of the present invention in conjunction with specific circuitry and implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device having a switchable test circuit comprising:
    a clock input to said device for receiving an external clock signal;
    a clock buffer circuit coupled to receive said external clock signal and an internal clock signal derived from said external clock signal having a frequency substantially higher than said external clock signal;
    a clock selection signal having first and second states thereof coupled to said clock buffer circuit for alternatively causing said clock buffer circuit to couple said external clock signal to an internal clock signal line when said clock selection signal is in said first state thereof or to couple said internal clock signal to said internal clock signal line when said clock selection signal is in said second state thereof;
    a clock enable input to said device for receiving an external clock enable signal;
    a clock enable buffer circuit coupled to said clock buffer circuit to receive said external clock enable signal;
    a switch to select between the external clock signal and the internal clock signal; and
    an output coupled to the switch for providing either the external clock signal or the internal clock signal.

2. The device of claim 1 wherein said frequency of said internal clock signal is substantially two times a frequency of said external clock signal.

3. The device of claim 1 wherein said clock enable buffer circuit is operative to provide an internal clock enable signal to said device in response to said external clock enable signal and said clock selection signal.

4. The device of claim 3 wherein said internal clock enable signal comprises a signal that is a logical OR of said external clock enable signal and said clock selection signal.

5. The device of claim 1 wherein said clock buffer circuit provides an output signal having a first phase thereof and said clock enable buffer circuit provides an output signal having a second phase thereof.

6. The device of claim 5 further comprising:
    an exclusive OR circuit coupled to receive said output of said clock buffer circuit and said output signal of said clock enable buffer circuit to provide said internal clock signal.

7. The device of claim 1 further comprising:
    a data input bus for supplying input data to said device in accordance with said external clock signal.

8. The device of claim 7 wherein said input data is operated on by said device at a frequency corresponding to said internal clock signal.

9. The device of claim 1 further comprising:
    a data output bus for supplying output data from said device in accordance with said external clock signal.

10. The device of claim 9 wherein said output data is operated on by said device at a frequency corresponding to said internal clock signal.

11. The device of claim 1 wherein said state of said clock selection signal is selected by means of a probe pad.

12. The device of claim 1 wherein said state of said clock selection signal is selected by means of a mode register.

13. The device of claim 1 wherein said state of said clock selection signal is selected by means of an external device pin.

* * * * *